United States Patent [19]

Kawakami

[11] Patent Number: 4,899,685
[45] Date of Patent: Feb. 13, 1990

[54] SUBSTRATE COATING EQUIPMENT
[75] Inventor: Kazushi Kawakami, Okayama, Japan
[73] Assignee: Tazmo Co., Ltd., Japan
[21] Appl. No.: 274,883
[22] Filed: Nov. 22, 1988
[30] Foreign Application Priority Data Nov. 23, 1987 [JP] Japan ................................ 62-295903

[51] Int. Cl.$^4$ ........................ B60G 11/22; B95C 11/08
[52] U.S. Cl. ........................................ 118/50; 118/52
[58] Field of Search ..................... 118/50, 52; 427/240

[56] References Cited

U.S. PATENT DOCUMENTS 4,280,689 7/1981 Frosch .................................. 118/52

*Primary Examiner*—Sam Silverberg
*Attorney, Agent, or Firm*—William A. Drucker

[57] ABSTRACT

This invention relates to a coating equipment to be used for coating a coating solution (coating diffusion agent, photo-resist agent, etc.) on a film which forms patterns of photo mask substrates (hereinafter merely called "substrates") used for production of reticle and photo masks or of glass substrates used for liquid crystal display. It features that said coating equipment comprises of a substrate table (spin head) being formed on the upper part of the spindle, a through hole whose dimension is a little larger than said substrate and whose section is of a reversed-U shape to said spin head being prepared at the central part of the upper part thereof, an aerial stream control frame body having a peripheral wall of a specified height and being provided with an air exhaust hole on said peripheral wall side, both said through hole and said aerial stream control frame body being able to rotate altogether, a doughnut-like cup being provided and arranged so that said aerial stream control frame body can be wrapped at the inside center thereof, an air suction hole of a little higher dimension than the height of the peripheral wall side of said aerial stream control frame body being drilled at the internal face thereof, and the bottom of said cup is interconnected to a pipe equipped with an exhaust fan.

2 Claims, 4 Drawing Sheets

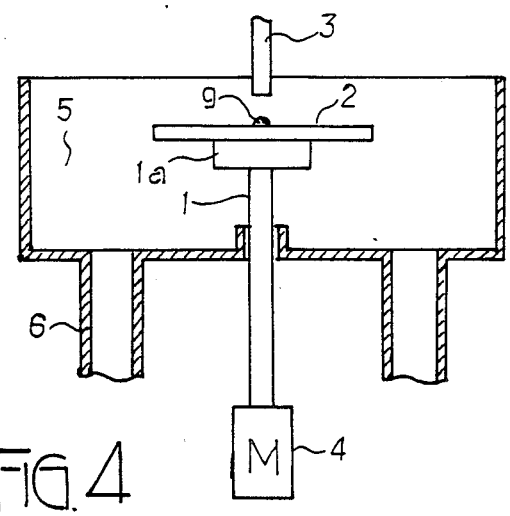
FIG. 4
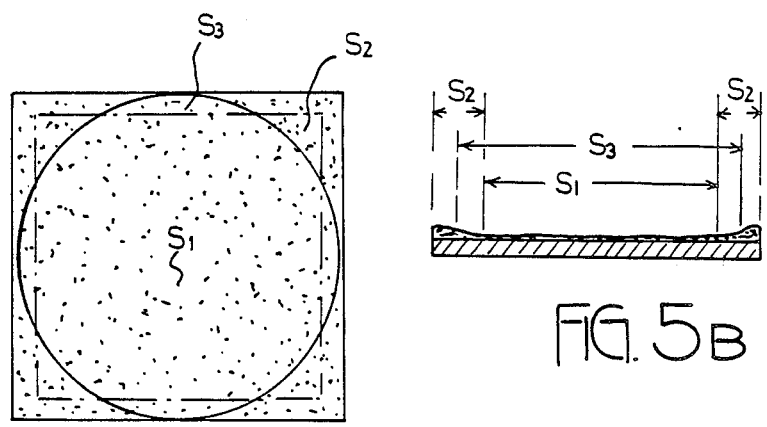
FIG. 5A
FIG. 5B

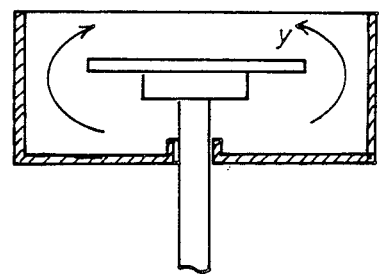
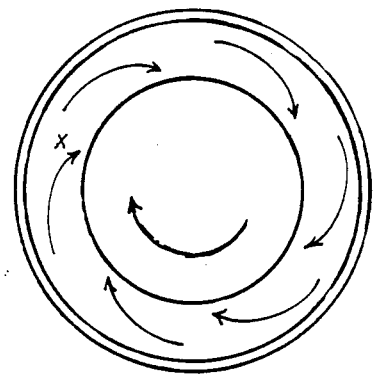
FIG 6A     FIG 6B
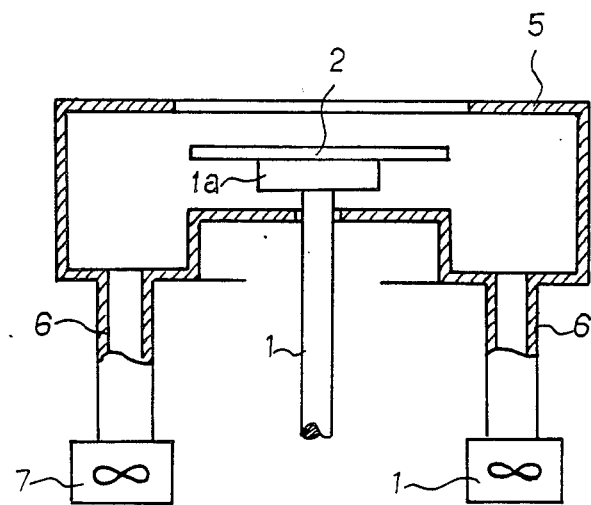
FIG. 7

SUBSTRATE COATING EQUIPMENT

BACKGROUND OF THE INVENTION

Spin treatment method by which a coating solution or agent is coated to a specified thickness at the center portion of a substrate placed on the spindle has been generally adopted for a coating solution coating work for substrates. It is very difficult to coat the coating solution or agent to a uniform thickness.

FIG. 4 is a sectional view showing a conventional coating equipment. In this figure, a spindle is indicated with "1", a substrate "2" is placed on the placing table of said spindle, a nozzle tube "3" is arranged for dropping a coating solution or agent on said substrate "2", a drive motor which can rotate said spindle "1" is indicated with "4", and a cup "5" and an discharge pipe "6" are provided to prevent a coating solution or agent from being splashed toward the vicinity of said placing table plate "1a" (spin head) on the upper part of said spindle "1". The working procedure for coating a coating solution or agent "g" to said subtrate "2" is as follows;

Namely, a subtrate "2" is placed on said placing table plate "1a" (spindle head) of said spindle "1" and is fixed by means of a vacuum adsorption means. With said subtrate "2" rested, a coating solution or agent "g" is dropped to the center of said substrate "2" through said nozzle tube "3". After that, said spindle "1" is rotated at a low speed (for example, 1,000 r.p.m.) by said drive motor "4", thereby causing said coating solution or agent "g" to be spread to the whole surface of said subtrate "2" and said substrate "2" is continuously rotated at a high speed (for example, 5,000 t.p.m.), thereby causing unnecessary amount of said coating solution or agent "g" to be splashed to the periphery of said subtrate and causing said coating solution or agent "g" to be uniform to a specified thickness (for example, about 1 micron) on said subtrate.

If the film of thus-coated solution or agent "g" is carefully observed in details, it can be found that there is some undulation or waves (or uneven distribution) on the coated surface of said substrate in the direction of rotation. The height of this undulation or wave is from 300 Å to 500 Å and is equivalent to 3 to 5% for the coating film thickness. Existence of such undulation and waves may adversely given influences upon generating patterns on wafers and masks. For example, if such patterns are lines, narrow part and wide part may exist in the thickness of such lines. The characteristics of semi-conductor devices may be greatly deteriorated.

When said coating solution or agent is coated on a rectangular substrate by means of said coating equipment, the coated film thickness of said coating solution or agent is almost uniform in the circular area "S1" outside the above undulation or wave as shown in FIG. 5 A (Plan view) and B (Sectional view). However, the coated film thickness of said coating solution or agent "g" is of uniform or may become abnormally thick at the four corners outside said circular area "S1".

Nevertheless, the effective area "S3" has been widening more and more to form patterns on said subtrate "2", it is remarkably difficult to unify the coated film thickness of said coating solution or agent even at the four corner area "S2". The reason why such peripheral sections are influenced by wind which may be generated by rotation and the coating solution or agent "g" may be dried from said four-corner area "S2", thereby causing the viscosity of said solution or agent "g" to become higher and higher. As a result, the resist at said peripheral four-corner area is hardened prior to the other part. The larger the size of a subtrate becomes, the larger this adverse influence becomes.

FIG. 6 illustrates a mechanism of aerial stream generation in the above situation. As adhesivity may exist in the air in a cup, said air in the cup rotates in the same direction as the spin head when said spin head rotate, and the rotation speed of said air may become different according to positions. Namely, the air in the vicinity of the spin head rotates at a speed which nearly the same as that of the spin head, and the rotation speed of the air may be decreased as being parted from the spin head. As the rotation speed of the air is different according to the positions, some inclination of the pressure (atmospheric pressure) is produced. That is, the atmospheric pressure in the vicinity of the spin head is low and it will become higher and higher as parting from the spin head. Therefore, as shown with arrows (X) and (Y) in FIG. 6, air is flown from the vicinity of the internal area at the side wall in the cup to the spin head. For this reason, particles of said coating solution or agent "g" which are sprung back due to eddy aerial stream are carried on in the vicinity of a subtrate in accompanying with said aerial stream and are adhered to said subtrate again.

In case of rectangular substrates, the peripheral area (four-corner area) on the surface of said coating solution or agent "g" is influenced by eddy aerial stream which is generated by rotation, thereby causing said coating solution or agent on said peripheral area (four-corner area) may be hardened and may be built up at the edge portions. Therefore, it is remarkably difficult to secure uniform thickness of coated film of said coating solution and agent "g".

Recently, a coating equipment which is shown in FIG. 7 is available as one of the means for unifying the thickness of coated film. This coating equipment comprises that a cup "5" is placed in the vicinity of the peripheral portion (at all the periphery) of a substrate "2" placed on the spin head 1a" and an exhaust pipe "6" and the exhaust drive system "7" are provided at the bottom of said cup "5". In this equipment, eddy aerial stream produced in said cup "5" due to difference of the atmospheric pressure (to be low pressure in the vicinity of the spin head "1a" and to become higher and higher as parting from the spin head "1a") which is generated in accompanying with the rotation of a subtrate "2" on the spin head 1a" is prevented by compulsorily exhausting said eddy aerial stream by means of a cup arranged in the vicinity of the peripheral portion of said subtrate "2".

However, in order to exhaust air to such a degree that eddy aerial stream, which is explained in FIG. 6, can be prevented, a large capacity of exhausting is requisite (i.e., the exhaust drive system is remarkably large-sized). At the same time, the exhaust loss may be remarkable due to defectives in structure. Therefore, as the exhaust efficiency is very bad, it is very difficult to secure effective exhaust uniformly from the whole periphery of said subtrate "2". In addition, it is also difficult to secure exhaust so that the coating film may not be influenced. Finally, it is very difficult to form the coating film uniformly..

OBJECTS OF THE PRESENT INVENTION

In summary, principal object of the present invention is to solve these above problems. Namely, according to the equipment disclosed by the present invention, an important object of the present invention is to get rid of spring-back of particles of coating solution or agent "g" which may be splashed out when coating said coating solution or agent "g" as rotating, to get rid of eddy aerial stream which is generated at the same time, and to secure uniform exhaust of air. Still another object of the prevent invention is to effectively prevent undulation or waves of said coating solution or agent "g" in the direction of rotation on the surface of a subtrate, and further still more important object of the present invention is to secure uniform coating thickness on the surface of said subtrate and to contribute to increasing the production efficiency. Still more, the equipment disclosed by the present invention can make it possible to uniformly coat said coating solution or agent "g" even on rectangular substrates. These and other objects of the present invention and many other features will be made apparent with the specifications and examples of embodiments of the present invention attached herein after.

BRIEF DESCRIPTION OF THE DRAWINGS

FIG. 4 is a rough sectional view of a conventional device.

FIG. 5 shows a condition of formation of coated film by a conventional equipment, "A" thereof is a plan view and "B" thereof is a sectional view.

FIG. 6 shows a condition of generation of aerial stream, "A" thereof is a plan view and "B" thereof is a sectional view.

FIG. 7 is a sectional view of another example of the conventional equipment.

DESCRIPTION OF THE PREFERRED EMBODIMENT

Example I of the preferred embodiment

Figure 1:
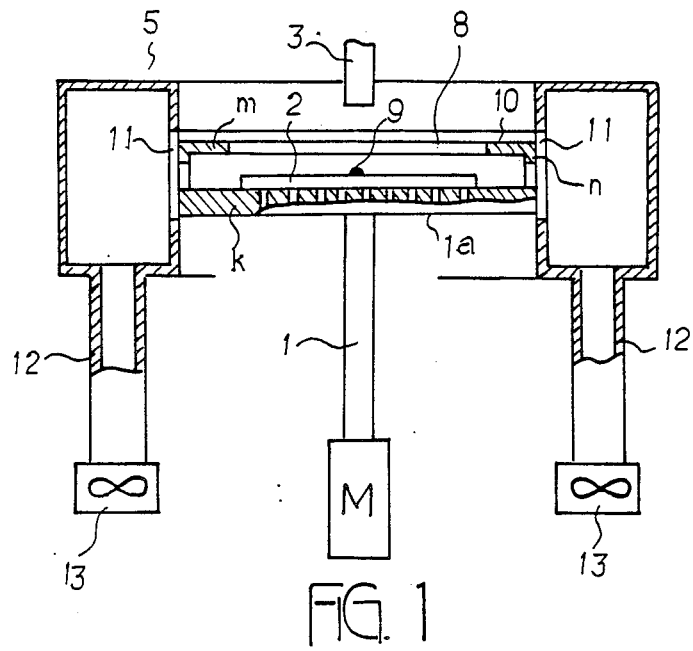
FIG. 1 is a rough sectional view of the equipment disclosed by the present invention.
Figure 2:
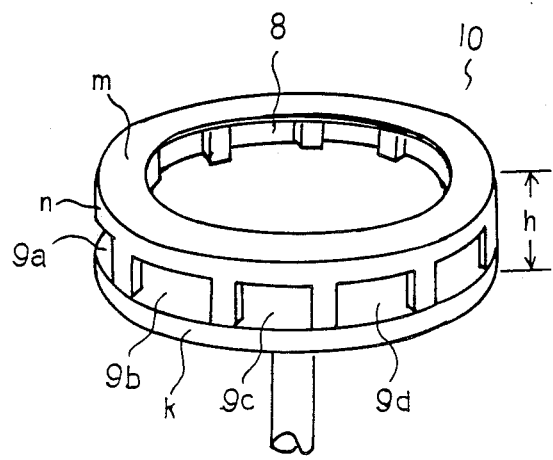
FIG. 2 is a part perspective view of a spin head employed in said equipment.
Figure 3:
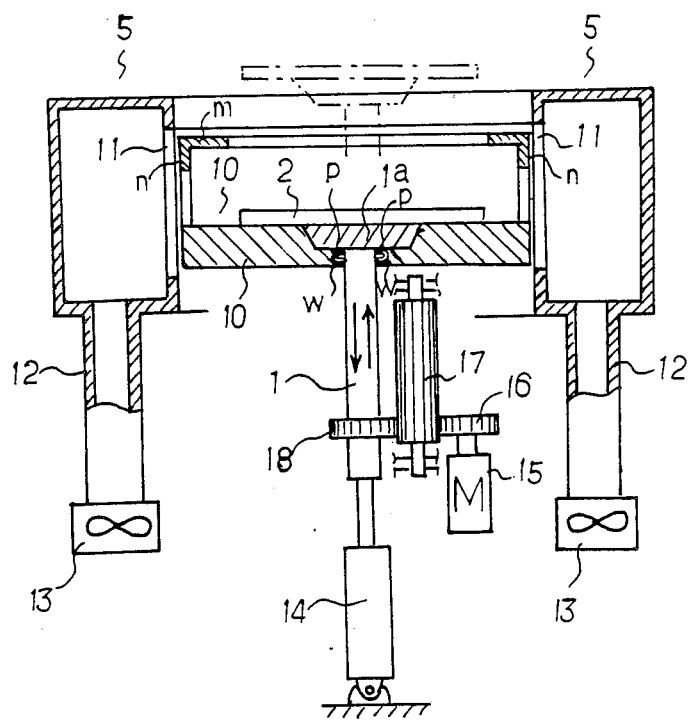
FIG. 3 is a rough sectional view showing another embodiment of the equipments disclosed by the present invention.

As shown in FIGS. 1 and 2, this equipment disclosed by the present invention comprises a spin head "1a" being formed on a plain plate "k" which is larger than a subtrate "2", an aerial stream control frame body "10" being integrally mounted on said plate plain "k" and is provided with a plurality of gate type slits "9a", "9b", "9c" . . . whose section is of a reversed U-shaped and ceiling plate "m" is of the same type as that of said plain plate "k" are drilled at the peripheral wall side having a certain fixed height, and an opening "8" of which diameter is larger than the dimensional diameter of said subtrate "2" being drilled at the center portion of said ceiling plate "m".

A cup "5" is so provided that said cup "5" can wrap said aerial stream control frame body "10" of the above construction at the center portion of said cup "5", and said cup "5" is just like a donut and is furnished with an air suction hole which is larger than the peripheral side wall height of said aerial stream control frame body "10" and which is integral with said spin head "1a", and a pipe "12" to exhaust air and to discharge waste solution of resist is provided at the bottom part of said air suction hole "11". Then, the lower part of said pipe "12" is interconnected to an exhaust fan "13".

The above construction operates as follows; A substrate "2" is placed at the vacuum adsorption part at the central part of said spin head "1a", and coating solution or agent "g" is dropped on said subtrate "2". Then, both said spin head "1a" and said subtrate "2" are rotated at a high speed, thereby causing unnecessary coating solution "g" to be splashed in said cup "5" through said gate type slits "9a", "9b", . . . of said aerial stream control frame body "10" by centrifugal force and a thin film of said coating solution or agent to be formed on said substrate "2".

At this time, any eddy aerial streams (X) and (Y) which are generated in the periphery of said subtrate "2" explained in reference with FIG. 6 will not occur at all as said spin head is integrally formed with said aerial stream control frame body "10" and rotates in synchronization with said subtrate "2" and compulsory exhaust of air can be carried out by means of said cup "5" having an air suction hole "11" so that said spin head can be wrapped by the center of said cut "5".

In addition, in the equipment disclosed by the present invention, air can be exhausted through said gate type slits "9a", "9b" . . . of said aerial stream control frame body "10" which constitutes said spin head. Therefore, in this equipment, only a small capacity of exhaust drive system is enough to exhaust air, thereby causing uniform exhaust control to be possible, and such an air exhaust that a small capacity of a exhaust drive system will not influence upon the coating film thickness on the surface of said subtrate "2" can be secured.

Example II of the preferred embodiment

The above embodiment relates to an equipment in which said aerial stream control frame body is integral with said spin head "1a" of the spindle "1". In this example, the equipment is of such that said spin head "1a" is separated from said aerial stream control frame body "10". Namely, said spindle is elevated and lowered in a certain fixed range of height by means of a fluid cylinder "14". At the upper end of said range of height a subtrate "2" can be mounted and dismounted in relation to said spin head "1a", and at the lower end of of said range of height said coating solution or agent "g" is given to said substrate "2". At this time, said spindle "1" is engaged with and disengaged from said aerial stream control frame body "10" by engagement of a dog piece "p" elastically built in the shaft portion of said spindle "1" with a through-hole "W" drilled in the internal peripheral face of said aerial stream control frame body "10". A motor "15" and a gear mechanism consisting of gears "16", "17" and "18" are provided to drive said spindle "1", and all the other construction is the same as that of the above example I of the preferred embodiment.

In this example, a subtrate can be mounted and dismounted on a subtrate transfer line, thereby causing total automation of works to be efficiently secured. Therefore, the equipment of this example II is very excellent for the purposes.

Having described by invention, what is claimed as new and desired to be secured by Letters Patent is;

1. Spin coating apparatus comprising
   (1). a subtrate placing table (spin head) having a vacuum adsorption hole to set and fix a subtrate on the upper surface of a spindle,
   (2). an air aerial stream control frame body furnished with a through hole whose section is of a reversed-U shape and whose diameter is larger than the size of said subtrate and furnished with a plurality of air exhaust ports at the peripheral side wall having a certain fixed height being mounted at said spin head and to rotate integrally with said spin head, and (3). a doughnut-like cup being so arranged that said cup can wrap said aerial stream control frame body in the center thereof, having an air suction hole of which size is a little larger than the peripheral side wall height of said aerial stream control frame body at the internal peripheral face of said cup, and a pipe provided with an exhaust fan being interconnected to the bottom of said cup.

2. In the apparatus of claim 1, wherein said spin head mounted at the upper part of said spindle is engageable with and disengageable from said aerial stream control frame body, and said spindle can be elevated and lowered in a certain fixed range of height by operation a fluid cylinder, whereby subtrate can be replaced at the upper end of the range of stroke of said fluid cylinder.

* * * * *